(12) United States Patent
Shivkumar et al.

(10) Patent No.: US 6,410,989 B1
(45) Date of Patent: Jun. 25, 2002

(54) CHIP-SCALE PACKAGE

(75) Inventors: Bharat Shivkumar, Los Angeles; Daniel M. Kinzer, El Segundo; Jorge Munoz, Cypress, all of CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/225,254

(22) Filed: Jan. 4, 1999

(51) Int. Cl.[7] .................. H01L 23/48; H01L 23/52; H01L 29/40
(52) U.S. Cl. ............. 257/784; 257/786; 257/773; 257/690; 257/780; 257/500
(58) Field of Search .................. 257/500, 784, 257/786, 780, 690, 773, 691, 692

(56) References Cited

U.S. PATENT DOCUMENTS

| | | | | |
|---|---|---|---|---|
| 4,947,234 A | * | 8/1990 | Einzinger et al. .......... 357/68 |
| 5,019,893 A | * | 5/1991 | Frank et al. .......... 357/81 |
| 5,663,869 A | * | 9/1997 | Vinciarelli et al. .......... 361/707 |
| 5,665,996 A | * | 9/1997 | Williams et al. .......... 257/401 |
| 5,783,866 A | * | 7/1998 | Lee et al. .......... 257/780 |
| 5,930,666 A | * | 7/1999 | Pankove .......... 438/615 |
| 6,091,089 A | * | 7/2000 | Hiraga .......... 257/203 |
| 6,133,632 A | * | 10/2000 | Davis et al. .......... 257/723 |

* cited by examiner

Primary Examiner—Tom Thomas
(74) Attorney, Agent, or Firm—Ostrolenk, Faber, Gerb & Soffen, LLP

(57) ABSTRACT

A substrate having upper and lower surfaces, the upper surface including a periphery defined by first and second spaced apart side edges and front and rear spaced apart edges; a power semiconductor die disposed on the upper surface of the substrate, the die including a top surface on which at least a first metalized surface is disposed and a bottom surface; a plurality of conductive pads disposed only at the second side edge of the substrate; and a plurality of wire bonds extending from the first metalized surface to the plurality of conductive pads.

8 Claims, 2 Drawing Sheets

CHIP-SCALE PACKAGE

BACKGROUND OF THE INVENTION

1. Field of the Invention

The present invention relates to semiconductor packages and, more particularly to surface mount power semiconductor packages in which substantially all wire bonds from the semiconductor die to peripheral pad areas are directed to only one side of the package.

2. Related Art

Surface mount power semiconductor packages are known. These packages typically include a power semiconductor die disposed substantially at the center of a package and include a plurality of pads located at the periphery of the package. These pads are usually located is around substantially all of the available peripheral area of the package or at least two sides of the package.

One or more wire bonds are disposed between metalized areas of the power semiconductor die to one or more of the peripheral pads. This provides input/output connections between electrodes of the package and the semiconductor It is desirable to utilize power semiconductor device packages exhibiting low total resistance, low thermal resistivity and high semiconductor die-to-package area ratios. Unfortunately, the prior art power semiconductor packages discussed hereinabove have not met each of these objectives at least because the large number of input/output pads disposed about the periphery the semiconductor package lowers the die to package area ratio. Package resistance and thermal conductivity also suffer when the input/output pads are disposed about the periphery of the package. These problems are exacerbated when multiple semiconductor die arrangements are desired, irrespective of whether the multiple semiconductor dies are mounted within the same package or in separate packages.

Accordingly, there is a need in the art for a new semiconductor package which ameliorates the problems of the prior art discussed above.

SUMMARY OF THE INVENTION

In order to overcome the disadvantages of prior art power semiconductor packages, the semiconductor package of the present invention includes a substrate having upper and lower surfaces, the upper surface including a periphery defined by first and second spaced apart side edges and front and rear spaced apart edges; a power semiconductor die disposed on the upper surface of the substrate, the die including a top surface on which at least a first metalized surface is disposed and a bottom surface; a plurality of conductive pads disposed only at the second side edge of the substrate; and a plurality of wire bonds extending from the first metalized surface to the plurality of conductive pads.

According to anther aspect of the invention, a semiconductor package includes a substrate having upper and lower surfaces, the upper surface including and a periphery defined by first and second spaced apart side edges and front and rear spaced apart edges; a first power MOSFET semiconductor die disposed on the upper surface of the substrate, the die including a top surface on which source and gate metalized surfaces are disposed and a bottom surface defining a drain; a second power MOSFET semiconductor die disposed on the upper surface of the substrate, the die including a top surface on which source and gate metalized surfaces are disposed and a bottom surface defining a drain; a plurality of conductive pads disposed only at the second side edge of the substrate; a first set of wire bonds extending from the source metalized surface of the first MOSFET die to one or more of the plurality of conductive pads, at least one of the wire bonds extending from the gate metalized surface of the first MOSFET die to one of the conductive pads; and a second set of wire bonds extending from the source metalized surface of the second MOSFET die to one or more of the plurality of conductive pads, at least one of the wire bonds extending from the gate metalized surface of the second MOSFET die to one of the conductive pads.

Other features and advantages of the present invention will become apparent from the description of the invention taken in conjunction with the accompanying drawing.

BRIEF DESCRIPTION OF THE DRAWINGS

For the purpose of illustrating the invention, there are shown in the drawing forms which are presently preferred, it being understood, however, that the invention is not limited to the precise arrangements and instrumentalities shown.

DETAILED DESCRIPTION OF THE PREFERRED EMBODIMENTS OF THE INVENTION

Figure 1:
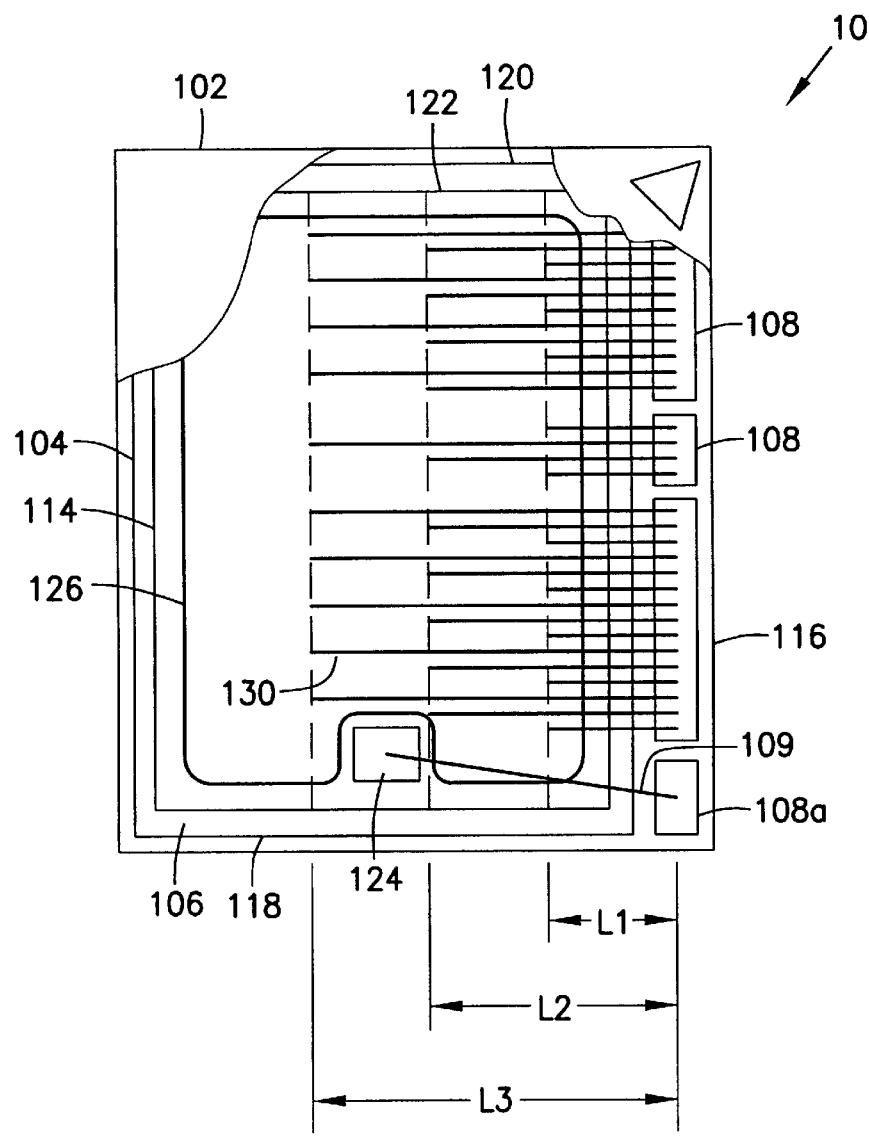
FIG. 1 is a top plan view of a power semiconductor package according to one aspect of the present invention.
Figure 2:
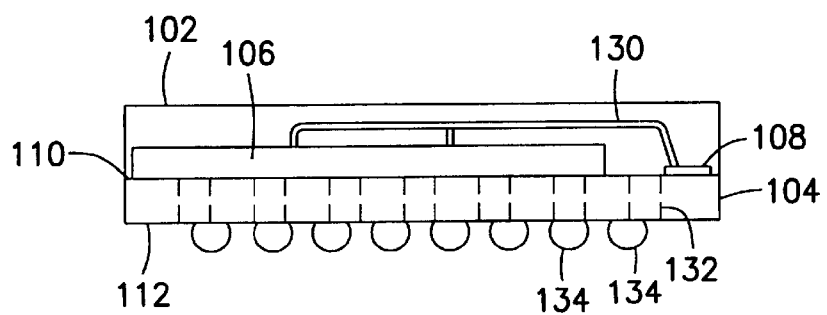
FIG. 2 is a side view of the semiconductor package of FIG. 1.

Referring now to the drawing wherein like numerals indicate like elements, there is shown in FIG. 1 a top plan view of a power semiconductor package 100 according to one aspect of the present invention. The power semiconductor package 100 includes a substrate 104, a power semiconductor,die 106, and a plurality of conductive pads 108. The substrate 104 is preferably in the form of a rectangular parallelepiped having electrical insulation properties. As best seen in FIG. 2, the substrate 104 includes upper and lower surfaces 110, 112, respectively. The substrate 104 also includes a periphery defined by first and second spaced apart side edges 114, 116 and front and rear peripheral edges 118, 120, respectively.

The conductive pads 108 are disposed at the second peripheral side edge 116 and, as is critical to the present invention, no conductive pads 108 are disposed at other peripheral edges of the substrate 104. The power semiconductor die 106 preferably occupies substantially the remainder of the upper surface 110 of the substrate 104 in order to maximize the die to package area ratio.

The power semiconductor die 106 preferably includes at least one first metalized surface 122 and most preferably also includes a second metalized surface 124. It is preferred that the power semiconductor die 106 be a MOSFET die which includes a source connection at the first metalized surface 122 and a gate connection at the second metalized surface 124. When the die 106 is a MOSFET die, a gate bus 126 is provided to ensure a distribution of the gate potential over the source.

A plurality of wire bonds 130 extend from the first metalized surface (source) 122 to one or more of the conductive pads 108. It is noted that the wire bonds 130 all extend in substantially the same direction, i.e., from the first metalized surface 122 towards the second peripheral side edge 116. It is preferred that certain of the wire bonds 130 have a first length L1, certain other of the wire bonds 130 have a second length L2, and still others of the wire bonds 130 have a third length L3.

The discrete wire bond lengths, L1, L2, and L3 are selected such that the total resistance of the semiconductor package 100 is minimized. Specifically, these lengths are selected as a function of the resistivity per unit length of the wire bonds 130, the contact resistance associated with the connection of respective ends of each wire bond 130 to the first metalized surface 122 and the conductive pads 108, and the resistivity per unit area of the first metalized surface 122. More particularly, as each wire bond has a finite resistance, it is desirable to have many wire bonds 130 to efficiently parallel the flow of current from the first metalized surface 122 to the conductive pads 108, thereby reducing the overall resistance of the wire bonds 130.

Further, in order to evenly distribute the flow of current through the first metalized surface (source) 122, it is desirable to vary the lengths of the wire bonds 130. It is most preferred that L2 be about two times the length of L1 and that length L3 be about three times the length of L1. It is noted that adjacent wire bonds 130 have differing lengths so that current flow is evenly distributed.

One or more wire bonds 109 may be employed to connect the second metalized surface (gate) 124 to one of the conductive pads 108a.

As best seen in FIG. 2, the substrate 104 includes a plurality of vias 132 which extend from the upper surface 110 to the lower surface 112. The vias 132 contain a conductive material to ensure electrical and thermal conductivity from the bottom surface of the semiconductor die 106 to the lower surface 112 of the substrate 104. Preferably, the vias 132 are. substantially filled with tungsten or a material of similar of greater electrical and thermal conductivity such that they are solid. This ensures that the vias 132 have a very low electrical and thermal resistance. It is most preferable that the vias have diameters which are maximized and also that the number of vias 132 is at a maximum.

It is understood that some of the vias provide electrical and thermal conductivity from the bottom surface of the semiconductor die 106 (the drain when the die 106 is a MOSFET) while other vias 132 provide electrical connection to one or more of the conductive pads 108. A plurality of conductive balls 134 forming a ball-grid array is disposed at the lower surface 112 of the substrate 104.

The ball-grid array provides electrical connections between the power semiconductor package 100 and a printed circuit board (not shown).

The use of solid vias 132 improves conduction and eliminates the need for a solder mask on the upper surface 110 of the substrate 104, thereby allowing the bottom surface of the semiconductor die 106 to come into direct thermal contact with the vias 132. This minimizes thermal resistance from the semiconductor die 106 to the ball-grid array.

A certain number of vias 132 are disposed between the conductive pads 108 and the semiconductor die 106 in order to maximize the surface area of the substrate 104 utilized by the semiconductor die 106. This improves the die-to-package surface area ratio. Indeed, it has been found that the semiconductor package 100 the present invention achieves die-to-package area ratio close to 70% (as opposed to prior art device which achieve only up to 40% ratios). 9

Figure 3:
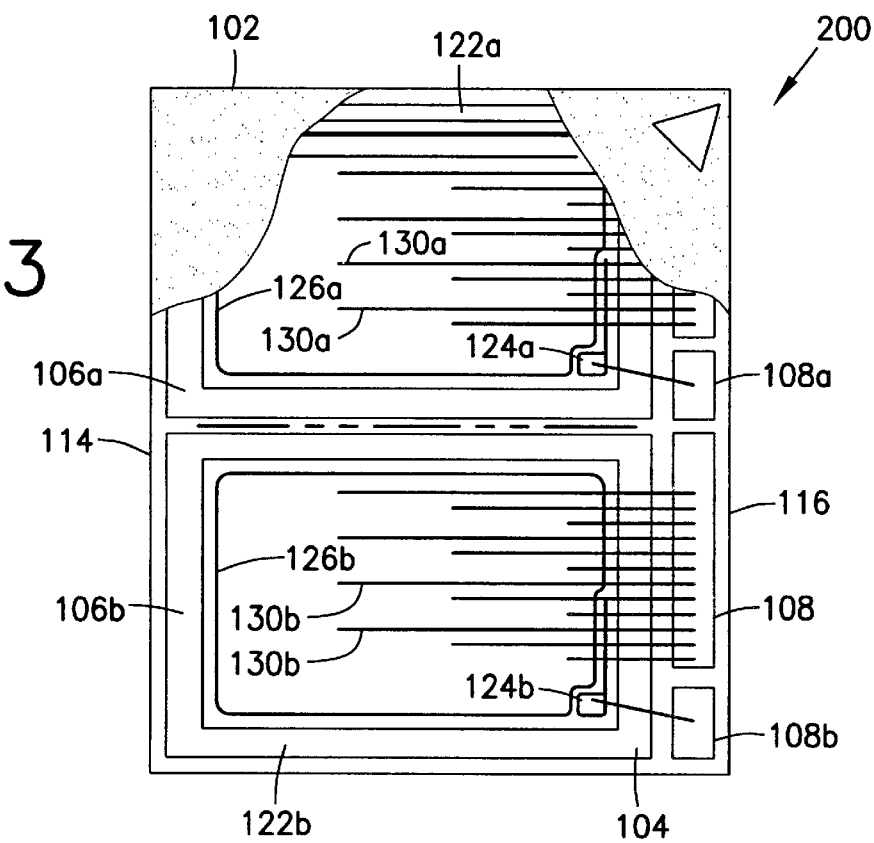
FIG. 3 is a top plan view of a semiconductor package according to another aspect of the present invention.

Reference is now made to FIG. 3 which shows a top plan view of a semiconductor package 200 in accordance with another aspect of the present invention where the same reference numerals indicate similar elements with respect to FIGS. 1 and 2.

The semiconductor package 200 of FIG. 3 includes a housing 102 preferably having the same footprint as the semiconductor package 100 of FIG. 1. The semiconductor package 200 further includes two power semiconductor die 106a and 106b, preferably MOSFET die (although other types of semiconductor devices are contemplated). The MOSFET die 106a, 106b are mounted on an upper surface 110 of a substrate 104. Conductive pads 108, 108a are also disposed at the second peripheral side edge 116 of the substrate 104.

It is noted that when the size of the semiconductor package 200 is substantially the same as the size of the semiconductor package 100, the individual MOSFET die 106a and 106b are roughly one half the size of the MOSFET die 106 of FIG. 1.

MOSFET die 106a and 106b include source metalization areas 102a, 102b and gate metalization areas 124a, 124b, respectively, on a top surface of the respective die. The source metalization areas 102a, 102b are coupled to the conductive pads 108 at the second peripheral side edge 116 via wire bonds 130a and 130b, respectively.

As was the case in the package 100 of FIG. 1, substantially all of the wire bonds 130a, 130b extend in one direction from the respective source metalization areas 122a, 122b towards the conductive pads 108 at the side edge 116. Also, a plurality of vias 132 and a ball-grid array substantially similar to those shown in FIG. 2 are included with the substrate 104 although not shown.

Figure 4:
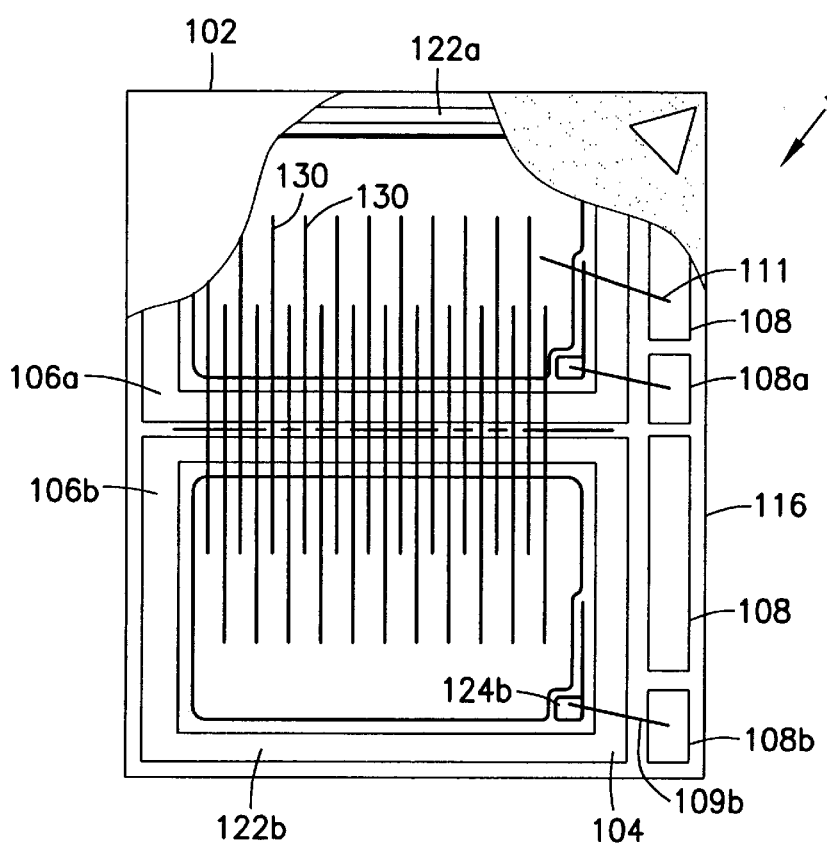
FIG. 4 is a top plan view of a semiconductor package of the present invention according to yet another aspect of the present invention.

Reference is now made to FIG. 4 which shows a top plan view of a semiconductor package 300 in accordance with yet another aspect of the present invention. By way of background, it is desirable in some instances to employ back-to-back MOSFET transistors (also known as AC switches) in which the respective sources of two MOSFET die are connected together. The semiconductor package 300 provides such an AC switch where the connection between respective sources of the MOSFET die are made entirely within the package in order to minimize the electrical resistance from drain-to-drain.

The semiconductor package 300 includes first and second MOSFET die 106a, 106b having respective source metalization areas 122a and 122b. The semiconductor die 106a and 106b are disposed on an upper surface of a substrate 104 in substantially the same way as with the package 200 of FIG. 3. A plurality of conductive pads 108, 108a, and 108b are disposed at one peripheral side edge 116 of the substrate 104. Respective gate metalization areas 124a, 124b are coupled to respective conductive pads 108a, 108b via gate wire bonds 109a, 109b.

High current access in an AC switch need only be made to respective drains of the MOSFET die 106a, 106b. Thus, a low current connection to the source metalization areas 122a, 122b is obtained using wire bond 111 terminating at one of the conductive pads 108 while high current connections between source metalization areas 106a and 106b are obtained using a plurality of wire bonds 130 running directly from one source metalization area 106a to the other source metalization area 106b. As discussed above, the resistance from one source 106a to the other source 106b is minimized by utilizing wire bonds 130 of different lengths and staggering them such that a uniform distribution of current is obtained through the source metalization areas 122a, 122b.

A plurality of vias 132 and a ball-grid array substantially similar to those shown in FIG. 2 are included with the substrate 104 although not shown.

The foregoing description of the preferred embodiments of the present invention have been provided for the purposes of illustration and description. It is not intended to be exhaustive or to limit the invention to the precise forms disclosed. Many modifications and variations are possible in light of the above teaching. It is intended that the scope of the invention be limited not be this detailed description, but rather by the claims appended hereto.

What is claimed is:

1. A power semiconductor package, comprising
   a substrate having upper and lower surfaces and a plurality of sides;
   a power semiconductor die disposed on the upper surface of the substrate, the die including a top surface on which at least a first metalized surface is disposed and a bottom surface;
   a plurality of conductive pads disposed on the upper surface of the substrate extending along only one side thereof; and
   a plurality of wire bonds extending from the first metalized surface to at least one of the plurality of conductive pads;
   wherein a first wire bond, a second wire bond and a third wire bond extend from the top surface of said power semiconductor die to one of said plurality of conductive pads, the second wire bond being twice as long as the first wire bond, and the third wire bond being three times as long as the first wire bond.

2. The power semiconductor package of claim 1, wherein the substrate includes a plurality of vias extending between the upper and lower surfaces.

3. The power semiconductor package of claim 2, wherein some of the vias provide electrical connection from the bottom surface of the semiconductor die through the substrate.

4. The power semiconductor package of claim 3, wherein the vias are substantially filled with conductive material such that they are solid.

5. The power semiconductor package of claim 3, wherein the conductive material is tungsten or other material of high electrical and thermal conductivity.

6. The power semiconductor package of claim 2, further including a plurality of conductive balls forming a ball grid array disposed at the lower surface of the substrate, at least some of the balls of the array for providing electrical connection from the conductive material of the vias to an external circuit.

7. The power semiconductor package of claim 1, wherein the semiconductor die is a power MOSFET die.

8. The power semiconductor package of claim 7, wherein the first metalized surface of the MOSFET die defines a source, the MOSFET die further including a second metalized surface defining a gate which is coupled to one of the plurality of conductive pads by way of a wire bond.

* * * * *